United States Patent [19]

Bernardi

[11] 4,364,977

[45] Dec. 21, 1982

[54] AUTOMATIC SELF-ADJUSTING PROCESSING APPARATUS

[75] Inventor: Carl E. Bernardi, San Jose, Calif.

[73] Assignee: National Semiconductor Corporation, Santa Clara, Calif.

[21] Appl. No.: 280,597

[22] Filed: Jul. 6, 1981

[51] Int. Cl.³ ............................ B05C 1/06; B05C 1/16
[52] U.S. Cl. ...................................... 427/429; 427/96; 118/686; 118/687; 118/669; 118/673; 118/680
[58] Field of Search ............... 118/686, 687, 669, 673, 118/680; 427/96, 429

[56] References Cited

U.S. PATENT DOCUMENTS

| | | | |
|---|---|---|---|
| 2,977,924 | 4/1961 | Bender et al. | 118/669 |
| 3,065,730 | 11/1962 | Lyons | 118/673 |
| 4,063,993 | 12/1977 | Burns | 427/96 X |

FOREIGN PATENT DOCUMENTS 154978 11/1963 U.S.S.R. ............................... 118/687

*Primary Examiner*—Shrive P. Beck
*Attorney, Agent, or Firm*—Neil B. Schulte; Gail W. Woodward; James A. Sheridan

[57] ABSTRACT

An automatic self-adjusting processing apparatus for plating an object is described. The apparatus has a plating head, an apparatus coupled to the plating head which is responsive to the presence of the object for indicating the relative position of the plating head and the object, and an apparatus coupled to the indicating apparatus for automatically adjusting, if necessary, the relative position of the plating head and the object to a predetermined relative position.

6 Claims, 4 Drawing Figures

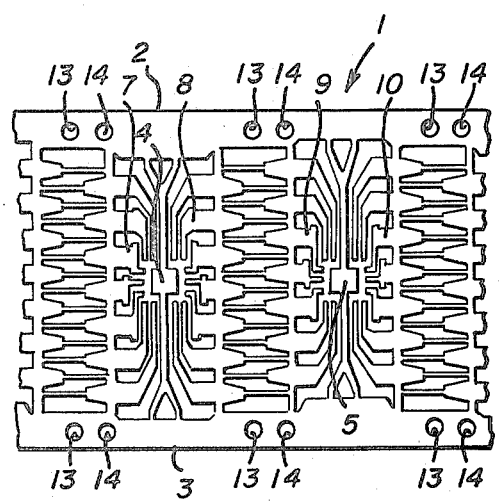
Fig_1
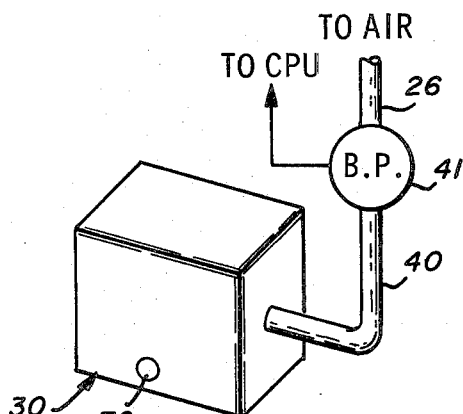
Fig_3
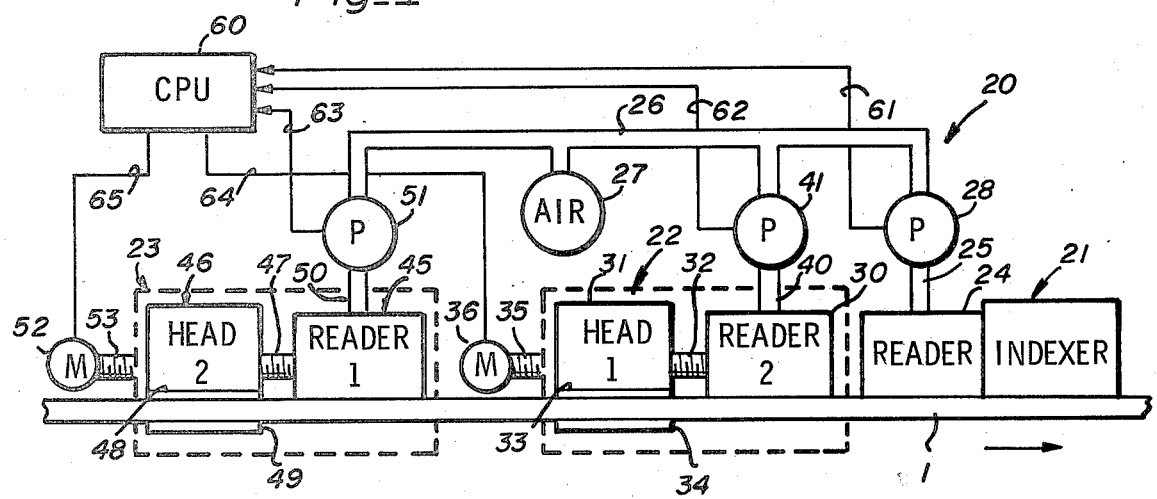
Fig_2
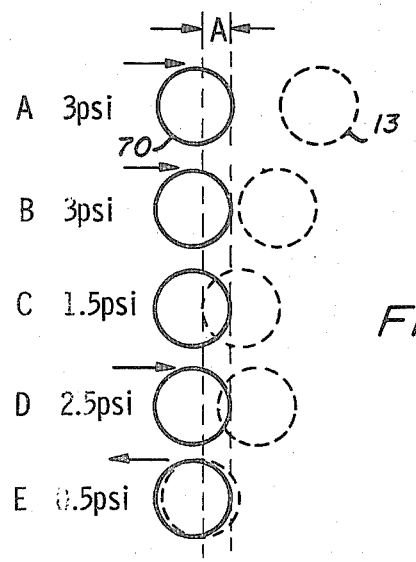
Fig_4

AUTOMATIC SELF-ADJUSTING PROCESSING APPARATUS

The present invention relates to material processing apparatus in general. In particular, it relates to a processing method and apparatus using a spot plating machine having a spot plating head and means for automatically and precisely aligning the plating head for plating die pads in a lead frame used in the fabrication of printed circuit components.

Plating machines used for spot plating die pads in a lead frame used in the fabrication of integrated circuit components typically comprise a plurality of treatment stations. Each of the treatment stations performs an operation in the plating process such as etching, cleaning, rinsing, plating and the like.

As the lead frame is advanced through the stations, it is intermittently stopped. The length of each intermittent stoppage, or dwell time, in the stations is selected to accommodate the plating process and specifically to accommodate the time it takes to perform the required treatment.

In the plating head in the plating station used for spot plating the lead frame, one or more plating orifices is provided. Surrounding the orifices there is typically provided a resilient sealing member. The sealing member is provided for masking the area surrounding the area to be plated, thereby exposing the area to be plated to plating solution and material discharged from the plating orifices while preventing the plating of surrounding areas.

One of the surfaces commonly plated in integrated circuit lead frame is the die pad. The die pad is provided for receiving an integrated circuit chip. To provide a good mechanical and electrical contact between the die pad and the integrated circuit chip, the die pad is typically plated with a precious metal, such as gold.

Heretofore, the plating stations were fixed in their position relative to other stations in the plating apparatus and to an indexing apparatus provided for indexing the lead frame through the machine. As lead frame was indexed through the stations by the indexing apparatus, the plating heads were opened and closed to accommodate the movement of the lead frame. Each time the lead frame was stopped, the plating head closed. After the plating head closed, the plating operation was commenced. After the plating operation was completed, the plating head opened and the next section of lead frame was indexed into the plating head.

In reel-to-reel plating of lead frame using a supply and a take-up reel, it has become a common practice to have from 20 to 30 feet, and on occasion as much as 50 feet of lead frame being processed between the supply and take-up reels.

In addition to normal mechanical stretching and relaxation of the lead frame as it is fed through the various treating stations, the lead frame is subjected to hot and cold treating solutions during the etching, cleaning, rinsing, plating and other treatments. The hot and cold solutions cause expansion and contraction of the lead frame. With normal stretching and expansion and contraction of the lead frame due to solution temperature changes, precise positioning of a die pad in a lead frame with respect to orifices in a plating head in a plating station has been difficult to achieve or maintain. Because it has been difficult to achieve or maintain precise positioning of a die pad in a lead frame in a plating head, it has been the practice to plate an excessive amount of the lead frame with a precious metal to insure that the desired area, namely, the die pad and/or leads, be plated with the precious metal regardless of the amount of stretching, expansion and contraction which a given lead frame might undergo.

Because of the increased cost of precious metals, such as gold, it has become increasingly important to reduce the amount of precious metal used for plating lead frames.

SUMMARY OF THE INVENTION

For the foregoing reasons a principal object of the present invention is a materials processing method and apparatus using a self-aligning treatment station.

Another object of the present invention is a method and apparatus as described above using a spot plating apparatus with an automatically adjustable plating head.

Still another object of the present invention is a method and an apparatus as described above for spot plating a lead frame with means for detecting the relative position of the lead frame and the plating head and means for adjusting the position of the plating head relative to the lead frame, if the plating head and the lead frame are not in a predetermined relative position.

Another object of the present invention is a method and an apparatus as described above in which the plating head comprises means for directing a fluid stream against the lead frame and means for measuring back pressure in the fluid stream for detecting the relative position of the lead frame in the plating head.

Still another object of the present invention is a method and an apparatus as described above which uses an apparatus for transporting/indexing the lead frame to the plating head with means for providing an output inhibiting the adjusting of the plating head relative to the lead frame in the absence of a predetermined positional relationship between the lead frame and the indexing apparatus.

In a preferred embodiment of the present invention, signals from an indexing apparatus used for transporting a lead frame through various treating stations, and signals from an apparatus used for indicating the relative position of a plating head and the lead frame is fed to a conventional microprocessor. Before the position of the plating heads is changed relative to a lead frame, there must be a predetermined positional relationship between the lead frame and the indexing apparatus. The microprocessor determines whether or not the position of the lead frame relative to the indexing apparatus is proper. If the relative position of the lead frame and the indexing apparatus is proper, and there is an indication that a plating head should be moved, the microprocessor sends signals to a stepping motor to advance or retreat the plating head relative to the lead frame so as to precisely position the plating spot on the lead frame.

BRIEF DESCRIPTION OF DRAWING

The above and other objects, features and advantages of the present invention will become apparent in the following detailed description of the accompanying drawing in which:

FIG. 1 is a representation of a section of a lead frame;

FIG. 2 is a block diagram of an embodiment of the present invention;

FIG. 3 is a perspective view of a reading head in accordance with the present invention;

FIG. 4 is a diagram of various relative positions of an orifice and a lead frame.

DETAILED DESCRIPTION OF A PREFERRED EMBODIMENT

Referring to FIG. 1, there is shown a representation of a section of a conventional lead frame designated generally as 1. In the lead frame 1, there is provided a pair of parallel rail members 2 and 3. Intermediate the rail members 2 and 3 there is provided a plurality of die pads 4, 5 and 6. Die pads 4, 5 and 6 which are provided for receiving and supporting an integrated circuit chip, are surrounded by a plurality of leads 7, 8, 9, 10, etc. In each of the rail members 2 and 3 there is provided a plurality of pairs of indexing holes 13 and 14. Each of the holes 13 and 14 has a fixed position relative to the die pads 4, 5 and 6.

Referring to FIG. 2, there is provided, in accordance with the present invention, a plating apparatus designated generally as 20. In the apparatus 20 there is provided an indexing apparatus 21, and a plurality of plating stations identified by broken lines designated generally as 22 and 23.

Mechanically coupled to the indexing apparatus 21 there is provided a dual orifice reader 24. Coupled to the reader 24 by means of a pipe 25 and a manifold 26, there is provided a source of fluid, such as air 27. To measure the air pressure in the reader 24, there is provided, coupled to the pipe 25, an air pressure gauge 28.

In the plating station 22 there is provided a single orifice reader 30 and a plating head designated generally as 31. The head 31 is adjustably coupled to the reader 30 by means of an adjusting screw 32. The adjusting screw 32 is provided for adjusting the position of the reader 30 relative to the head 31.

In the plating head 31 there is provided a resilient masking member 33 and a movable backup plate 34. The masking member 33 is provided for masking off all but the die pad to be plated in the lead frame 1. The backup plate 34 is provided for pressing the lead frame 1 against the masking member 33 to thereby provide a fluid tight seal therewith.

Coupled to the plating head 31 by an adjusting screw 35 there is provided a stepping motor 36. The stepping motor 36 and screw 35 are provided for adjusting the position of the plating head 31 relative to the lead frame 1.

The reader 30 is coupled to the manifold 26 and source of air 27 by means of a pipe 40. Coupled to the pipe 40 there is provided a pressure gauge 41. The gauge 41 is provided for measuring air pressure in the reader 30 and pipe 40.

In the plating station 23 there is provided a single orifice reader 45 and a plating head 46. The plating head 46 is adjustably coupled to the reader 45 by means of an adjusting screw 47. The adjusting screw 47 is provided for adjusting the position of the reader 45 relative to the head 46.

The reader 45 is coupled to the manifold 26 and the source of air 27 by means of a pipe 50. A pressure gauge 51 is coupled to the pipe 50 for measuring the air pressure in the pipe 50 and reader 45.

The readers 30 and 45 are substantially identical. Accordingly, only one of the readers, namely reader 30 will be described in detail below with respect to FIG. 3.

Referring to FIG. 3, there is provided in the reader 30 an orifice 70. The orifice 70 is connected by internal piping (not shown) to the external pipe 40. The external pipe 40 is, as previously described, coupled to the pressure gauge 41, to the manifold 26 and to the source of air 27. Typically, the orifice 70 has a diameter of approximately 0.060 inch which corresponds to the diameter of the indexing holes 13 and 14 in the rails 2 and 3 of the lead frame 1 described above with respect to FIG. 1.

The pressure gauges 41 and 51 are coupled to a conventional signal processing apparatus 60 such as a microprocessor, by means of a plurality of signal lines 62 and 63, respectively. The stepping motors 36 and 52 are coupled to the output of the signal processing apparatus 60 by means of a plurality of control lines 64 and 65, respectively.

As described above, in one embodiment thereof, the invention is provided for plating die pads 4, 5 and 6, and/or the surrounding plurality of leads 7, 8, 9, 10, etc., with precious metal with a high degree of precision to thereby reduce the amount of precious metal required to plate the desired areas.

In operation, the lead frame 1 is transported through the plating stations 22 and 23 by means of the indexing apparatus 21. To obtain the desired precision plating, it is necessary to accurately position the plating heads relative to the lead frame 1. To accurately position the plating heads relative to the lead frame, it is necessary to first reference the position of the indexing apparatus 21 relative to the plating stations 22 and 23.

To initially position the plating stations 22 and 23 relative to the indexing apparatus 21, a section of the lead frame 1 is unwound from a supply reel (not shown), and threaded through the plating stations 22, 23 and attached to a take up reel (not shown). With the lead frame 1 attached to the take up reel, it is placed in a predetermined position with respect to the indexing apparatus 21 such that the lead frame is indicated to be correctly positioned in the indexing apparatus 21 by a predetermined output from the gauge 28.

With the lead frame 1 in the desired reference position relative to the indexing apparatus 21, the position of the plating station 22 comprising the head 31 and the reader 30 associated therewith is then adjusted. The position to which the plating station 22 is adjusted is such that a hole 13 of the lead frame 1 is placed in a predetermined position with respect to a hole 70 in the reader 30.

Typically, the predetermined initial position to which the station 22 is adjusted is such that the hole 13 in the lead frame 1 overlaps, but is not entirely in registration with, the hole 70 in the reader 30. With the hole 13 placed in the predetermined position with respect to the hole 70 in the reader 30, air from the source of air 27 is transported through the pipes 26 and 40 and discharged from the hole 70. If the hole 13 was entirely in registration with the hole 70, there would be a maximum air flow through the hole 13 and consequently, a minimum of back pressure measured by the pressure gauge 41 coupled to the lines 26 and 40. In a typical embodiment, the back pressure under these conditions is about 0.5 pound per square inch (psi). If, on the other hand, the hole 13 in the lead frame 1 is displaced from the hole 70 by a malfunction or the like such that a minimum of air is discharged from the hole 70 through the hole 13 or is blocked entirely by the lead frame 1, there results a buildup of back pressure measured by the pressure gauge 41 to a maximum magnitude of approximately 3 psi.

In the case of a misalignment, to determine the direction in which the reader 30 must be moved to place the hole 70 in the above described predetermined initial position relative to the hole 13, the initial position of the reader 30 relative to the lead frame is chosen such that the back pressure measured by the pressure gauge 41 is intermediate, the maximum and minimum back pressure described above. The intermediate pressure chosen is, for example, 1.5 psi. In other words, whenever the gauge 41 measures a back pressure of 1.5 psi, the lead frame 1 is presumed to be in the desired predetermined position relative to the reader 30 and the indexing apparatus 21.

With the reader 30 in the predetermined position relative to the indexing hole 13 and the pressure gauge 41 measuring 1.5 psi, the position of the head 31 is then adjusted relative to the reader 30. This is done by means of the adjusting screw 32 so that the plating nozzle of the head 31 is precisely located in a predetermined position relative to the lead frame 1 and the desired area to be plated.

After the plating station 22 is adjusted for a predetermined back pressure as measured by the pressure gauge 41 and the head 31 is adjusted relative to the indexing apparatus 21 and lead frame 1 to a predetermined position relative to a desired plating area on the lead frame 1 associated therewith, the same adjustments are made with respect to the position of the plating station 23 and the head 46 therein.

As described above with respect to the station 22, the plating station 23, comprising the head 46 and the reader 45, is first moved relative to the lead frame 1. The station 23 is moved relative to the lead frame 1 until a hole 13 is placed in a predetermined position relative to a hole 70 in the reader 45 so that the pressure gauge 51 measures 1.5 psi, a pressure intermediate the minimum and maximum back pressure obtainable as described above with respect to the reader 30 associated with the plating station 22. With the pressure measuring device 51 measuring 1.5 psi, the head 46 is then adjusted by means of the screw 47 to position the head in a predetermined position relative to an adjacent desired plating area on the lead frame 1.

In practice, after the indexing apparatus 21 and the plating stations 22 and 23 are initially set up as described above, lead frame 1 is transported to the plating stations 22 and 23 for plating by the indexing apparatus 21. In a conventional manner, the indexing apparatus 21 intermittently transports the lead frame 1 through the plating stations 22 and 23. Prior to each time the lead frame 1 is moved, the backing plates 34 and 49 are moved from a closed position to an open position. After the lead frame 1 is moved so as to position another set of desired plating areas in the plating stations for plating, the backing plates 34 and 49 close against the lead frame so as to form a fluid tight seal between the lead frame 1 and the head masks 33 and 48 in the plating stations 22 and 23, respectively. After the backing plates 34 and 49 are moved to their closed position and the lead frame 1 is sealed in a fluid tight manner against the heads 31 and 46 in the plating stations 22 and 23, respectively, the desired plating areas positioned within the heads are plated. At the same time, the pressure in the reader 30 and 45 is measured by the pressure gauges 41 and 51, respectively. If due to temperature changes or due to mechanical stretching or the like, a hole 13 in the lead frame 1 is not in a position relative to the hole 70 in an associated reader such that the pressure gauge associated therewith reads 1.5 psi, an appropriate signal is transmitted to the signal processing apparatus 60. The apparatus 60 then generates a corresponding control signal.

After a predetermined period of time required for plating the desired areas has elapsed, the backing plates 34 and 49 are opened and lead frame 1 is advanced by the indexing apparatus 21 to position the next set of desired plating areas in the plating stations. As the lead frame 1 is being advanced, each of the plating stations 22 and 23 are moved relative to its previous position, if necessary, to reduce or increase, as required, the back pressure measured by their pressure gauges 41 and 51 to 1.5 psi. When the predetermined movement of lead frame 1 by the indexing apparatus 21 is completed and the backing plates 34 and 49 are closed, plating of a new set of desired plating areas is commenced. At this time another reading is made of the back pressure in the readers 30 and 45 by the pressure gauge 41 and 51, respectively. If the back pressure is at a value other than 1.5 psi, the position of the plating station is again adjusted in the appropriate direction during the next time the heads are open.

Referring to FIG. 4, there is disclosed 2 columns of pairs of circles A-E. The solid circles represent the nozzle 70 in one of the readers 30 and 45, and the broken circles represent a hole 13 in the lead frame 1.

In practice, an adjustment of the position of a plating station relative to the lead frame is limited to a predetermined maximum number of discrete steps by the processing apparatus 60 during any single adjusting period. The number of steps corresponds to the diameter of the hole 13. Consequently, during any one adjustment of the position of a plating station, so long as the back pressure detected equals or exceeds 3 psi, the plating station is always advanced the maximum number of steps by the stepping motor. If during a subsequent measurement of the back pressure from one or more of the readers, the back pressure has a magnitude less than 3 psi, the signal from the processing apparatus 60 steps the motor in a direction to move the plating station right or left relative to the lead frame 1 by an amount determined by the magnitude and difference between the magnitude of the back pressure measured and 1.5 psi.

As shown in FIG. 4, the circles 70 and 13 of pair A are separated by more than the maximum amount of movement which the stepping motor can adjust for during one adjusting period. Accordingly, the plating station will be moved to the right during the next two adjusting periods as shown by the circles designated B and D. The circles C show that the hole 13 is in the predetermined position relative to the hole 70 such that the back pressure has a magnitude of 1.5 psi. Consequently, no adjustment is made to the position of the plating station involved during the next available adjusting period. The circles D, on the other hand, show that the hole 13 is to the right of the hole 70 requiring, during the next adjusting period, a movement of the plating station to the right to reduce the magnitude of the back pressure from an assumed 2.5 psi to 1.5 psi. The circles E, on the other hand, show that the hole 13 is too far to the left of the reference point relative to the hole 70 such that during the next adjusting period the plating station is moved to the left relative to the lead frame 1 as shown by the arrow associated therewith to increase the back pressure from an assumed 0.5 psi to 1.5 psi.

During the processing of the signals by the processing apparatus 60 and the transportation of the lead frame by the indexing apparatus 21, the position of the lead frame is determined. This determination is made and sent to the processing apparatus 60 for inhibiting the adjusting of the plating stations if the lead frame is not correctly positioned in the indexing apparatus. If that should occur, appropriate signals are generated to appraise the operator of a major malfunction in the apparatus so that the same can be corrected.

While a preferred embodiment of the present invention is described, it is contemplated that various changes and modifications thereto may be made without departing from the spirit and scope of the present invention. For example, while two plating stations are disclosed and described, it is understood that an apparatus incorporating the present invention, in certain applications, may employ only a single plating station or may employ more than two plating stations. Under such circumstances, corresponding modifications must be made to the apparatus including the plating apparatus 20 to insure that a corresponding one of the desired plating areas in the lead frame 1 is properly positioned within a plating station provided therefore.

For these reasons it is intended that the embodiment described be used only for purposes of illustrating the present invention and that the scope thereof be determined solely by reference to the claims hereinafter provided and their equivalents.

What is claimed is:

1. A self-adjusting object processing apparatus comprising:

a plating head;

indicating means for indicating the relative position of said processing apparatus and said object, said indicating means including means to convey a stream of fluid to a hole in said object, the relative position of the hole in the object and said indicating means having an effect on the pressure of said fluid;

pressure indicating means for indicating the magnitude of the fluid pressure; and adjusting means responsive to said pressure indicating means for automatically adjusting the position of said plating head relative to said object as a function of the magnitude of said pressure.

2. The apparatus of claim 1 wherein said pressure indicating means indicates the magnitude of fluid back pressure.

3. The apparatus of claim 2 including means for transporting the hole in the object into and out of registration with said fluid stream so that the magnitude of said back pressure varies between a maximum when the hole and the fluid stream are out of registration and a minimum when the hole and stream are in registration and in which said adjusting means adjusts said plating head to a position such that said back pressure has a predetermined value intermediate said maximum and said minimum.

4. The apparatus of claim 1 wherein said object comprises a lead frame and said hole is located in a rail of said lead frame.

5. The apparatus of claim 3 wherein said means for transporting comprises means for indicating when said object is not at a predetermined position relative to said transporting means and means for inhibiting the adjustment of said plating head when said object is not at said predetermined position.

6. A method of plating an object comprising the steps of:

transporting the object to a plating head;

directing a stream of fluid against at least one aperture in said object;

measuring the back pressure in said stream;

providing an output that is a function of said back pressure; and if necessary, adjusting the position of the plating head to obtain a predetermined output.

* * * * *